United States Patent
Takahara et al.

(10) Patent No.: US 11,201,040 B2
(45) Date of Patent: Dec. 14, 2021

(54) SUBSTRATE SUPPORTING UNIT AND FILM FORMING DEVICE HAVING THE SUBSTRATE SUPPORTING UNIT

(71) Applicant: NHK SPRING CO., LTD., Yokohama (JP)

(72) Inventors: Go Takahara, Yokohama (JP); Toshihiko Hanamachi, Yokohama (JP); Arata Tatsumi, Yokohama (JP)

(73) Assignee: NHK SPRING CO., LTD., Yokohama (JP)

( * ) Notice: Subject to any disclaimer, the term of this patent is extended or adjusted under 35 U.S.C. 154(b) by 34 days.

(21) Appl. No.: 16/553,988

(22) Filed: Aug. 28, 2019

(65) Prior Publication Data

US 2019/0385827 A1 Dec. 19, 2019

Related U.S. Application Data

(63) Continuation of application No. PCT/JP2018/002914, filed on Jan. 30, 2018.

(30) Foreign Application Priority Data

Feb. 28, 2017 (JP) .............................. JP2017-036608

(51) Int. Cl.
*H01J 37/32* (2006.01)
*H01L 21/67* (2006.01)
(Continued)

(52) U.S. Cl.
CPC ........ *H01J 37/32724* (2013.01); *C23C 14/50* (2013.01); *C23C 14/541* (2013.01);
(Continued)

(58) Field of Classification Search
USPC ......... 118/728, 729, 730, 715, 725, 500, 58; 219/634, 385, 443.1, 444.1, 468.1, 476
See application file for complete search history.

(56) References Cited

U.S. PATENT DOCUMENTS 7,053,339 B2 * 5/2006 Goto ...................... H05B 3/283
219/444.1
9,698,074 B2 * 7/2017 Merry ............... H01L 21/67248
(Continued)

FOREIGN PATENT DOCUMENTS

JP 2000-54141 A 2/2000
JP 2001-237051 A 8/2001
(Continued)

OTHER PUBLICATIONS

International Search Report and Written Opinion of the International Searching Authority for corresponding international application PCT/JP2018/002914 dated Apr. 10, 2018, with English translation of the International Search Report.
(Continued)

*Primary Examiner* — Yewebdar T Tadesse
(74) *Attorney, Agent, or Firm* — Hauptman Ham, LLP

(57) ABSTRACT

A substrate supporting unit is provided. The substrate supporting unit possesses a shaft, a first heater, and a stage. The first heater is located in the shaft and is configured to heat an upper portion of the shaft. The stage is located over the shaft and includes a first plate, a second plate over the first plate, and a second heater between the first plate and the second plate.

10 Claims, 8 Drawing Sheets

(51) Int. Cl.
*H01L 21/687* (2006.01)
*C23C 16/458* (2006.01)
*C23C 14/50* (2006.01)
*C23C 14/54* (2006.01)

(52) U.S. Cl.
CPC ........ *C23C 16/458* (2013.01); *C23C 16/4583* (2013.01); *C23C 16/4586* (2013.01); *H01L 21/67248* (2013.01); *H01L 21/67253* (2013.01); *H01L 21/68735* (2013.01); *H01L 21/68785* (2013.01); *H01L 21/68792* (2013.01); *H01J 2237/3321* (2013.01); *H01J 2237/3341* (2013.01)

(56) References Cited

U.S. PATENT DOCUMENTS

| | | | |
|---|---|---|---|
| 2003/0183616 A1 | 10/2003 | Goto | |
| 2006/0151465 A1* | 7/2006 | Lin | H01L 21/67109 219/444.1 |
| 2014/0083995 A1 | 3/2014 | Takahara et al. | |
| 2015/0076135 A1 | 3/2015 | Merry et al. | |
| 2016/0021707 A1 | 1/2016 | Ibrani | |

FOREIGN PATENT DOCUMENTS

| | | | |
|---|---|---|---|
| JP | 2002-270347 A | 9/2002 |
| JP | 2002-319474 A | 10/2002 |
| JP | 2004-6242 A | 1/2004 |
| JP | 2005-166368 A | 6/2005 |
| JP | 2008-527746 A | 7/2008 |
| JP | 4311922 B2 | 5/2009 |
| JP | 4953572 B2 | 6/2012 |
| JP | 2014-99313 A | 5/2014 |
| JP | 5712054 B2 | 3/2015 |
| JP | 2016-536803 A | 11/2016 |
| JP | 2016536803 A | 11/2016 |
| KR | 10-2004-0074001 A | 8/2004 |
| KR | 10-2009-0056536 A | 6/2009 |
| KR | 10-2010-0137795 A | 12/2010 |
| KR | 10-2015-0022485 A | 3/2015 |
| WO | 2004/032187 A2 | 4/2004 |
| WO | 2013162000 A1 | 10/2013 |
| WO | 2015/038610 A1 | 3/2015 |

OTHER PUBLICATIONS

Decision of Refusal issued for corresponding Japanese Patent Application No. 2019-502520 dated Oct. 6, 2020, along with an English machine translation.
Extended European Search Report issued for corresponding European Patent Application No. 18760416.0 dated Nov. 9, 2020.
English Translation of Written Opinion of the International Searching Authority for the International Application No. PCT/JP2018/002914 dated Apr. 10, 2018.
Japanese Office Action dated Apr. 14, 2020, in connection with the Japanese Patent Application No. 2019-502520.
Office action issued for corresponding Korean Patent Application No. 10-2019-7024023 dated Jan. 5, 2021, along with an English machine translation.
Notice of Allowance issued for corresponding Korean Patent Application No. 10-2019-7024023 dated Aug. 24, 2021, along with an English machine translation.

* cited by examiner

SUBSTRATE SUPPORTING UNIT AND FILM FORMING DEVICE HAVING THE SUBSTRATE SUPPORTING UNIT

CROSS REFERENCE TO RELATED APPLICATION

This application is based upon and claims the benefit of priority from the prior Japanese Patent Application No. 2017-036608, filed on Feb. 28, 2017. Further, this application is a continuation of the National Phase Application of International Application No. PCT/JP2018/002914, filed on Jan. 30, 2018. Both of the priority documents are hereby incorporated by reference.

FIELD

The present invention relates to a substrate supporting unit or a film processing device and a film forming device having the substrate supporting unit.

BACKGROUND

A semiconductor device is mounted in almost all electronic devices and has an important role for the functions of the electronic devices. A semiconductor device utilizes the semiconductor properties of silicon or the like and is structured with a number of thin films including not only a semiconductor but also an insulator and a conductor. Formation and processing of these thin films are performed by a photolithography process. A photolithography process generally includes formation of a thin film utilizing an evaporation method, a sputtering method, a chemical vapor deposition (CVD) method, a chemical reaction of a substrate, or the like, formation of a resist film over the thin film. light-exposure and development to from a resist mask, partial removal of the thin film with etching, and removal of the resist mask.

In each step of the lithography process, a variety of reaction conditions determines the properties of the thin film, and one of the conditions is the temperature of a substrate. In most cases, the temperature of a substrate is controlled by adjusting the temperature of a supporting base (hereinafter, referred to as a stage) on which the substrate is placed. Japanese Patent No. 5712054, Japanese Patent Application Publication No. 2005-166368, and Japanese Patent No. 4311922 disclose a substrate supporting unit including a stage to which a heater for controlling the temperature of a substrate is installed and a shaft for supporting the stage.

SUMMARY

An embodiment of the present invention is a substrate supporting unit. The substrate supporting unit possesses a shaft, a first heater, and a stage. The first heater is located in the shaft and is configured to heat an upper portion of the shaft. The stage is located over the shaft and includes a first plate, a second plate over the first plate, and a second heater between the first plate and the second plate.

DESCRIPTION OF EMBODIMENTS

An object of an embodiment of the present invention is to provide a substrate supporting unit for precisely controlling a temperature of a substrate as well as a film forming device or a film processing device having the substrate supporting unit.

Hereinafter, each embodiment of the present invention disclosed in the present application is explained with reference to the drawings. The invention can be implemented in a variety of different modes within its concept and should not be interpreted only within the description of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

First Embodiment

Hereinafter, a substrate supporting unit according to an embodiment of the present invention and a film processing device including the substrate supporting unit are explained using FIG. 1 to FIG. 4B.

1. Film Forming Device

Figure 1:
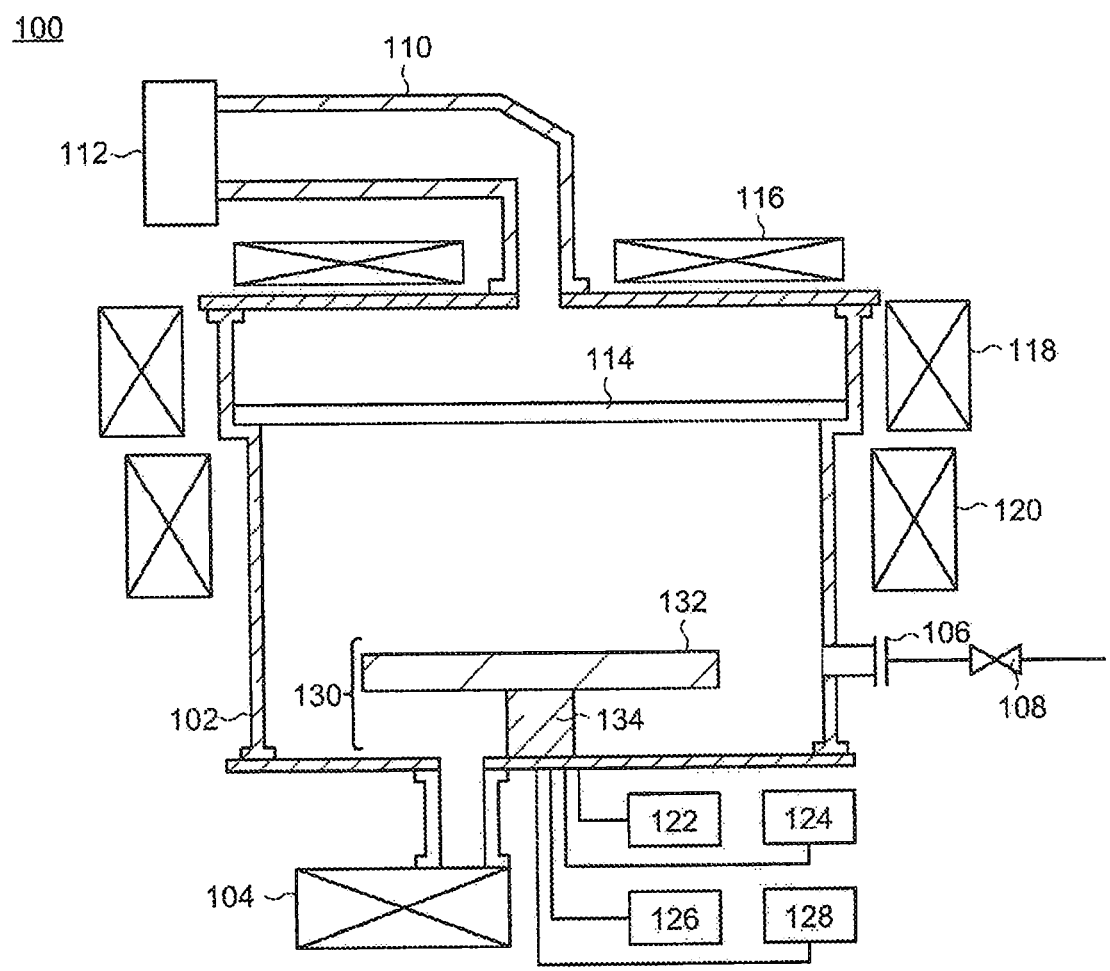
FIG. 1 is a drawing showing a structure of a film processing device according to an embodiment of the present invention.

In FIG. 1, an etching device 100 for dry-etching a variety of films is illustrated as an example of the film forming device according to the First Embodiment of the present invention. The etching device 100 possesses a chamber 102. The chamber 102 supplies a space for etching a film of a conductor, an insulator, a semiconductor, or the like formed over a silicon substrate, a glass substrate, and the like.

An exhaust device 104 is connected to the chamber 102, by which the inside of the chamber 102 can be set at an evacuated atmosphere. The chamber 102 is further equipped with an inlet tube 106 for introducing a reaction gas, and the reaction gas for etching is supplied into the chamber 102 through a valve 108. As the reaction gas, a fluorine-containing organic compound such as tetrafluorocarbon ($CF_4$), octafluorocyclobutane (c-$F_4F_8$), decafluorocyclopentane (c-$C_5F_{10}$), and hexafluorobutadiene ($C_4F_8$) is represented, for example.

A microwave source 112 may be provided to an upper portion of the chamber 102 through a waveguide tube 110. The microwave source 112 has an antenna or the like to supply a microwave and outputs a high-frequency microwave such as a microwave of 2.45 GHz and a radio wave (RF) of 13.56 MHz. A microwave generated in the microwave source 112 is transmitted to the upper portion of the chamber 102 by the waveguide tube 110 and is introduced into the chamber 102 through a window 113 including quartz, ceramics, or the like. The reaction gas is plasmatized by the microwave, and etching of the film proceeds with electrons, ions, and radicals included in the plasma.

The substrate supporting unit 130 for supporting a substrate and controlling a temperature of the substrate is arranged at a lower portion of the chamber 102. The substrate supporting unit 130 possesses a shaft 134 and a stage 132 disposed over the shaft 134. The substrate is placed over the stage 132. A power source 122 is connected to the stage 132, and a high-frequency power is provided to the stage 132 to result in an electric field caused by the microwave in a direction perpendicular to a surface of the stage 132 and a surface of the substrate. Magnets 116, 118, and 120 may be disposed at the upper portion or on a side surface of the chamber 102. The magnets 116, 118, and 120 may be permanent magnets or electromagnets having an electromagnetic coil. The magnets 116, 118, and 120 generate a magnetic field component parallel to the surfaces of the stage 132 and the substrate. Electrons in the plasma receive the Lorentz force to resonate in association with the electric field caused by the microwave and are bounded at the surfaces of the stage 132 and the substrate. Accordingly, it is possible to generate a high-density plasma on the surface of the substrate.

A heater power source 126 is connected to the stage 132 for controlling heaters (first heater and second heater described below) provided to the stage 132 and the shaft 134. A power source 124 for an electrostatic chuck fixing the substrate to the stage 132 may be further connected to the stage 132. A rotation-controlling device 128 for rotating the stage 132 may be optionally provided to the etching device 100.

2. Substrate Supporting Unit

Figure 2A:
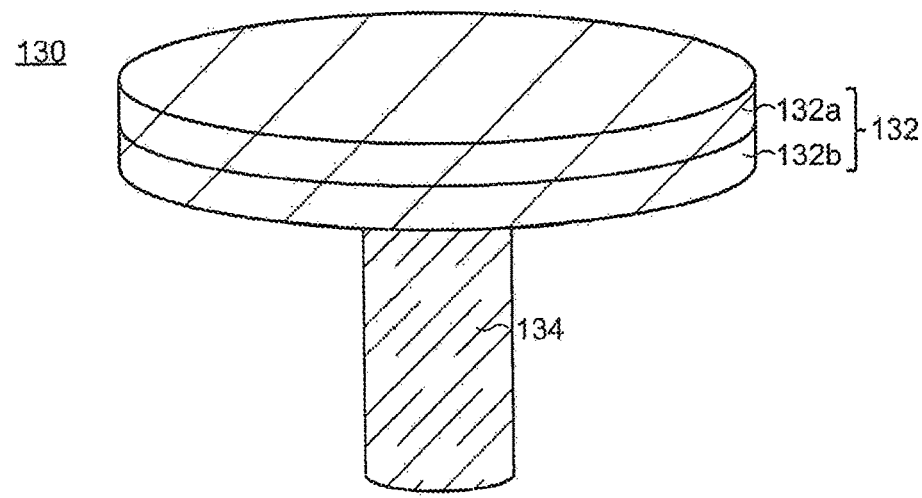
FIG. 2A is a schematic perspective view of a substrate supporting unit according to an embodiment of the present invention.

FIG. 2A shows a schematic perspective view of the substrate supporting unit 130. As shown in FIG. 2A, the substrate supporting unit 130 possesses the shaft 134 and the stage 132 disposed over the shaft 134.

<1. Stage>

The stage 132 may have two plates, and an example is demonstrated in which a lower plate 132b and an upper plate 132a located over the lower plate 132b are provided. The upper plate 132a and the lower plate 132b may be connected to each other with a screw or may be fixed by welding or brazing. A main material of the upper plate 132a and the lower plate 132b is a metal, and titanium, aluminum, stainless, and the like are exemplified as a material. Although not shown, an opening may be formed on a bottom surface of the lower plate 132b to install a temperature sensor. A thermocouple or the like may be used as a temperature sensor. Although a circular stage 132 is illustrated in FIG. 2A, the shape of the stage 132 is not limited, and the stage 132 may have an elliptic shape or a polygonal shape such as a quadrangle.

Figure 2B:
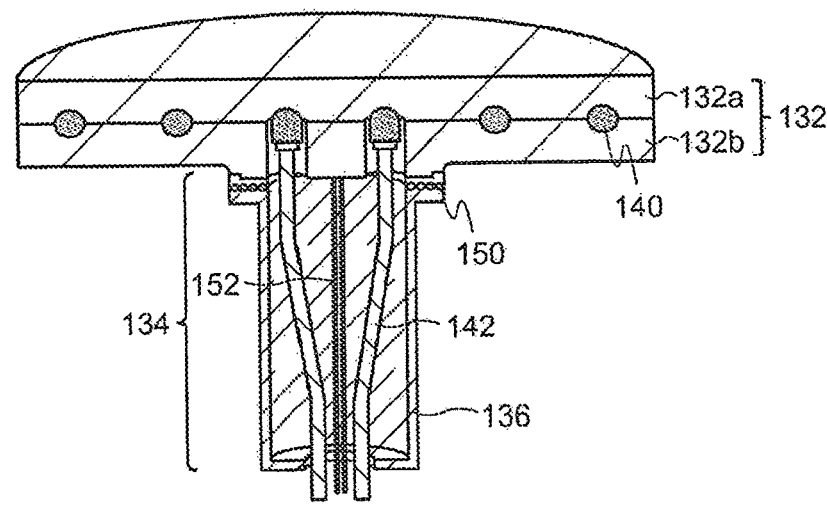
FIG. 2B is a perspective view of a cross-section of a substrate supporting unit according to an embodiment of the present invention.
Figure 2C:
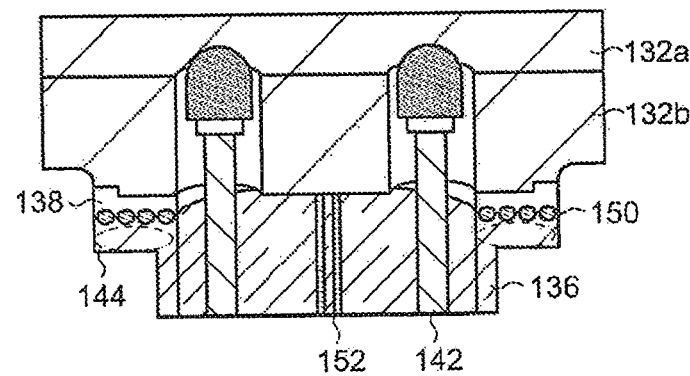
FIG. 2C is a schematic cross-sectional view of a substrate supporting unit according to an embodiment of the present invention.

A perspective view of a cross section of the substrate supporting unit 132 is shown in FIG. 2B, and an enlarged drawing of the center portion of FIG. 2B is illustrated in FIG. 2C. As demonstrated in FIG. 2B, the stage 132 has a second heater 140 between the lower plate 132b and the upper plate 132a. The second heater 140 is installed to heat the stage 132 and is arranged along trenches formed in the lower plate 132b and the upper plate 132a. Note that the trench may be formed only in one of the lower plate 132b and the upper plate 132a.

Figure 3A:
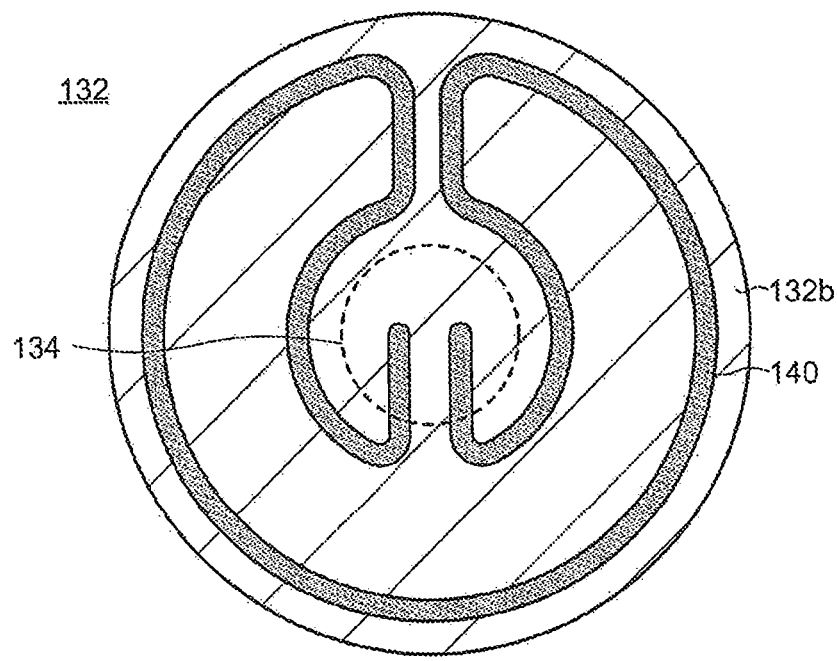
FIG. 3A is a schematic top view of a substrate supporting unit according to an embodiment of the present invention.

A schematic top view of the stage 132 is illustrated in FIG. 3A. FIG. 3A shows a state where the upper plate 132a is omitted from the stage 132. As shown in FIG. 3A, the second heater 140 is arranged over the entire stage 132, thereby heating the whole of the stage 132.

As a typical example of the second heater 140, a sheath heater is represented. A sheath heater possesses a metal sheath in which a heating element including a metal capable of generating heat upon being supplied with current and an insulator surrounding the heating element are disposed. The heating element may include a metal selected from tungsten, nickel, chromium, cobalt, and molybdenum. The metal may be an alloy including these metals and may be an alloy of nickel and chromium or an alloy including nickel, chromium, and cobalt, for example. As an insulator, aluminum oxide, titanium oxide, chromium oxide, zirconium oxide, magnesium oxide, yttrium oxide, and a composite oxide thereof are represented.

As demonstrated in FIG. 2B, the second heater 140 is connected to wirings 142 which extend in the shaft 134 from the center of the stage 132 and are connected to the heater power source 126 shown in FIG. 1. The current flowing in the second heater 140 is controlled by the heater power source 126, thereby controlling the temperature of the stage 132.

<2. Shaft>

The shaft 134 supports the stage 132 and possesses a main shaft 136 and optionally a connector 138 (FIG. 2B and FIG. 2C). When the connector 138 is disposed, the connector 138 may be arranged so as to be in contact with at least one of the lower plate 132b and the main shaft 136. The shaft 134 and the stage 132 may be connected to each other by welding or brazing.

The main shaft 136 may have a tube shape. When the stage 132 has a circular shape, the stage 132 and the main shaft 136 can be configured so that a normal line of the stage 132 passing through the center thereof passes through a cross section of the main shaft 136 or the center of the cross section. An area of the stage 132 is larger than a cross-sectional area of the main shaft 136. A hollow or a space is formed in the main shaft 136 in which the wirings 142 are arranged. As shown in FIG. 2C, a flange 144 (a portion indicated with a dotted ellipse in this drawing) may be formed at a top edge of the main shaft 136. In the case where the flange 144 is formed, the flange 144 has a ring shape and forms an edge portion of the main shaft 136. When the connector 138 is provided, the connector 138 may be arranged to have a ring shape and cover the flange 144.

The main shaft 136 and the connector 138 may include the material usable for the upper plate 132a and the lower plate 132b. For example, the main shaft 136, the upper plate 132a, and the lower plate 132b may include the same material, which leads to high reliability of the connection between the shaft 134 and the stage 132 because there is no difference in thermal expansion coefficient therebetween. When different materials are used for the shaft 134, the stage 132, and the connector 138, a difference in thermal expansion coefficient therebetween may be equal to or more than $0.2 \times 10^{-6}$/K and equal to or less than $2.0 \times 10^{-6}$/K, equal to or more than $0.5 \times 10^{-6}$/K and equal to or less than $1.0 \times 10^{-6}$/K, or equal to or more than $0.7 \times 10^{-6}$/K and equal to or less than $0.9 \times 10^{-6}$/K. In addition, in order to improve the effect of preventing the heat from being deprived from the shaft 134, a high heat-conductive material and a low heat-conductive material are respectively used for the connector 138 and the main shaft 136. In this case, at least one of the high heat-conductive material and the low heat-conductive material may be different from the material included in the upper plate 132a and the lower plate 132b.

A first heater 150 for heating an upper portion of the main shaft 136 is further installed to the shaft 134. For example, the first heater 150 may be arranged between the main shaft 136 and the lower plate 132b or between the main shaft 136 and the connector 138 as shown in FIG. 2B and FIG. 2C. Although not illustrated, the first heater 150 may be disposed between the connector 138 and the lower plate 132b.

Figure 3B:
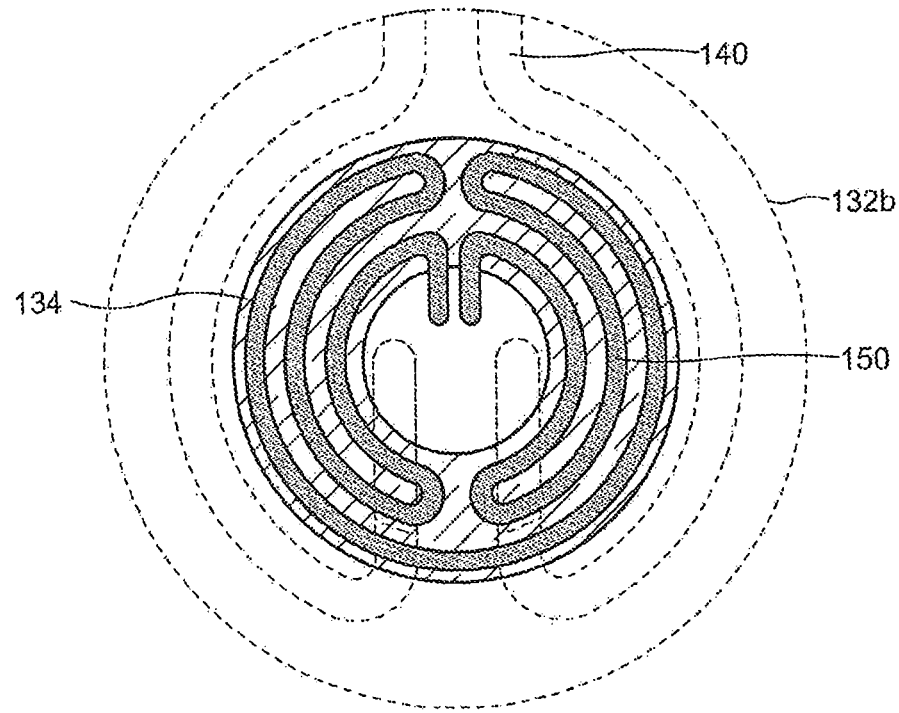
FIG. 3B is a schematic top view of a substrate supporting unit according to an embodiment of the present invention.

The first heater 150 is arranged so as to surround the shaft 134 or the hollow of the main shaft 136. Furthermore, the heater 150 is arranged so as to surround the normal line of the stage 132 passing through the center of the stage 132. When the flange 144 is provided, the first heater 150 may be disposed along the trenches formed in the flange 144 and the connector 138 as shown in FIG. 2C. Note that the trench may be formed only in one of the flange 144 and the connector 138. FIG. 3B shows a top view of the shaft 134. Here, a part of the second heater 140 and a part of the lower plate 132b are illustrated with dotted lines. As shown in FIG. 2C and FIG. 3B, the first heater 150 may be formed in a plane formed by the flange 144 so that a part of the first heater 150 overlaps with a plurality of concentric circles.

Similar to the second heater 140, a sheath heater may be used as the first heater 150. Terminals of the first heater 150 are connected to wirings 152 (FIG. 2B and FIG. 2C) which extend in the hollow of the main shaft 136 and are connected to the heater power source 126 shown in FIG. 1. Current flowing in the first heater 150 is controlled with the heater power source 126, thereby controlling the temperature of the upper portion of the main shaft 136.

The first heater 150 and the second heater 140 may be configured so that a cross-sectional area of the first heater 150 is smaller than a cross-sectional area of the second heater 140. That is, the first heater 150 and the second heater 140 may be configured so that a cross-sectional area of the heating element installed in the first heater 150 is small compared with that installed in the second heater 140. Accordingly, it is possible to densely arrange the first heater 150 to the main shaft 136 and the flange 144 having smaller areas than the stage 132.

A temperature range of a substrate set in a semiconductor process is wide, and a substrate may be frequently heated at 500° C. or higher. Heating a substrate at such a high temperature requires large electrical power to be supplied to the second heater 140 provided to the stage 132. Hence, a heating element having a large cross-sectional area is employed in the second heater 140, which promotes the use of a sheath heater having a large cross-sectional area as the second heater 140. When a sheath heater having a large cross-sectional area is deformed and used as shown in FIG. 1, a curvature radius is limited at the bent portion. Namely, although it is easy to gently bend the second heater 140, it is difficult to bend it at a large curvature radius. Hence, it is difficult to make heater density uniform between around the center and in the peripheral region of the stage 132. More specifically, although the second heater 140 can be arranged at a high density in the peripheral region of the stage 132, it is difficult to arrange the second heater 140 at a high density at the center and its vicinity. Additionally, since the shaft 134 is arranged around the center of the stage 132, the heat of the stage 132 is readily deprived through the shaft 134. Accordingly, the temperature of the center of the stage 132 and its vicinity tends to be lower than that of the peripheral region. For these reasons, it is not always easy to maintain the whole of the stage 132 at a uniform temperature.

In contrast, the substrate supporting unit 130 shown in the present embodiment is equipped with the first heater 150 for heating an edge portion of the shaft 134, that is, a part of the shaft 134 close to the stage 132, in addition to the second heater 140 heating the stage 132. Furthermore, the first heater 150 can be densely arranged to the members such as flange 144 and the connector 138 having a small area because the cross-sectional area of the first heater 150 is smaller than that of the second heater 140. Accordingly, heating the edge portion of the shaft 134 prevents a decrease in temperature of the center of the stage 132 and the vicinity thereof. As a result, the temperature of the whole of the stage 132 can be readily maintained uniformly, which realizes precise control of the temperature of a substrate.

<3. Other Structures>

Figure 4A:
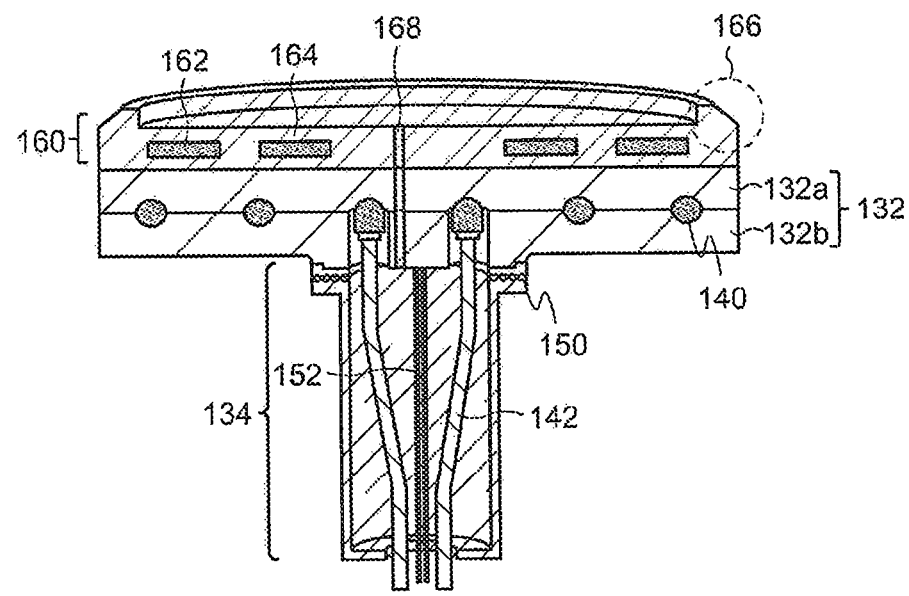
FIG. 4A is a perspective view of a cross section of a substrate supporting unit according to an embodiment of the present invention.

The stage 132 may further include an electrostatic chuck 160 as a mechanism to fix a substrate over the stage 132 (FIG. 4A). The electrostatic chuck 160 may have a structure in which an electrostatic-chuck electrode 162 is covered by an insulating film 164, for example. Application of a high voltage (from several hundred volts to several thousand volts) to the electrostatic-chuck electrode 162 from the power source 124 (see FIG. 1) generates charges in the electrostatic-chuck electrode 162. Simultaneously, charges with a polarity opposite to the charges generated in the electrostatic-chuck electrode 162 are generated at a reverse surface of the substrate. A Coulomb force between the charges with different polarities enables the substrate to be fixed. As an insulator, ceramics such as aluminum oxide, aluminum nitride, and boron nitride can be used. Note that the insulating film 164 is not completely insulative and may have a conductivity to some extent (e.g., resistivity in the order from $10^9$ Ω·cm to $10^{12}$ Ω·cm). In this case, the aforementioned ceramics is doped with a metal oxide such as titanium oxide, zirconium oxide, and hafnium oxide in the film 164. A rib 166 may be disposed at a periphery of the electrostatic chuck 160 to determine the position of the substrate.

The stage 132 may further include one or a plurality of through holes 168 as an optional structure. A helium inlet tube may be provided to the chamber 102 to allow a gas such as helium having a high thermal conductivity to flow through the through hole 168. This structure allows the gas to flow in a gap between the stage 132 and the substrate, thereby efficiently transferring the thermal energy of the stage 132 to the substrate.

Figure 4B:
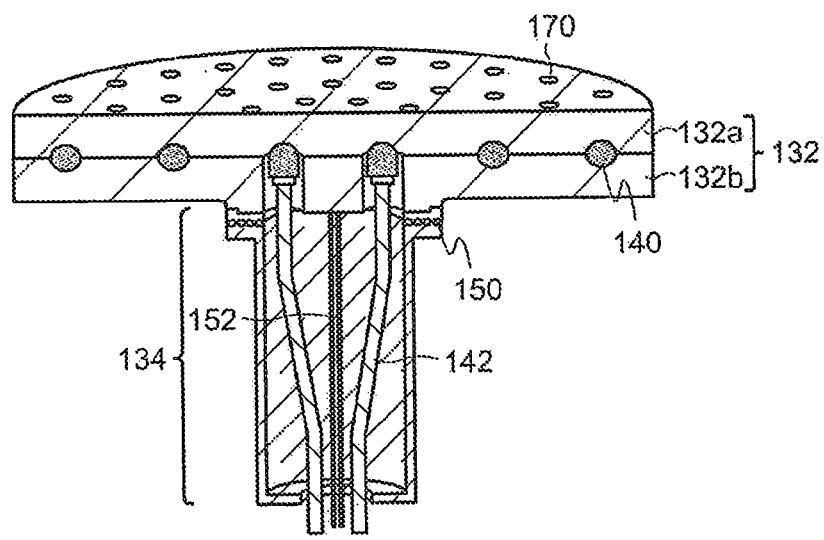
FIG. 4B is a perspective view of a cross section of a substrate supporting unit according to an embodiment of the present invention.

Instead of forming the electrostatic chuck 160 for fixing a substrate over the stage 132, a function of a vacuum chuck may be provided to the stage 132. As shown in FIG. 4B, a substrate may be fixed by forming a plurality of vacuum holes 170 in the upper plate 132a and suctioning gas using an aspirator which is not illustrated to stick the substrate over the upper plate 132, for example.

Although not illustrated, a trench (flow channel) for circulating a medium for controlling the temperature of a substrate may be formed in the stage 132. As a medium, a fluid medium such as water, an alcohol exemplified by isopropanol and ethylene glycol, and silicon oil can be used. In this case, the trench is formed in one or both of the upper plate 132*a* and the lower plate 132*b*, and then the upper plate 132*a* and the lower plate 132*b* are bonded by brazing or the like. The medium may be used in both cases of cooling and heating the stage 132.

Second Embodiment

Figure 5:
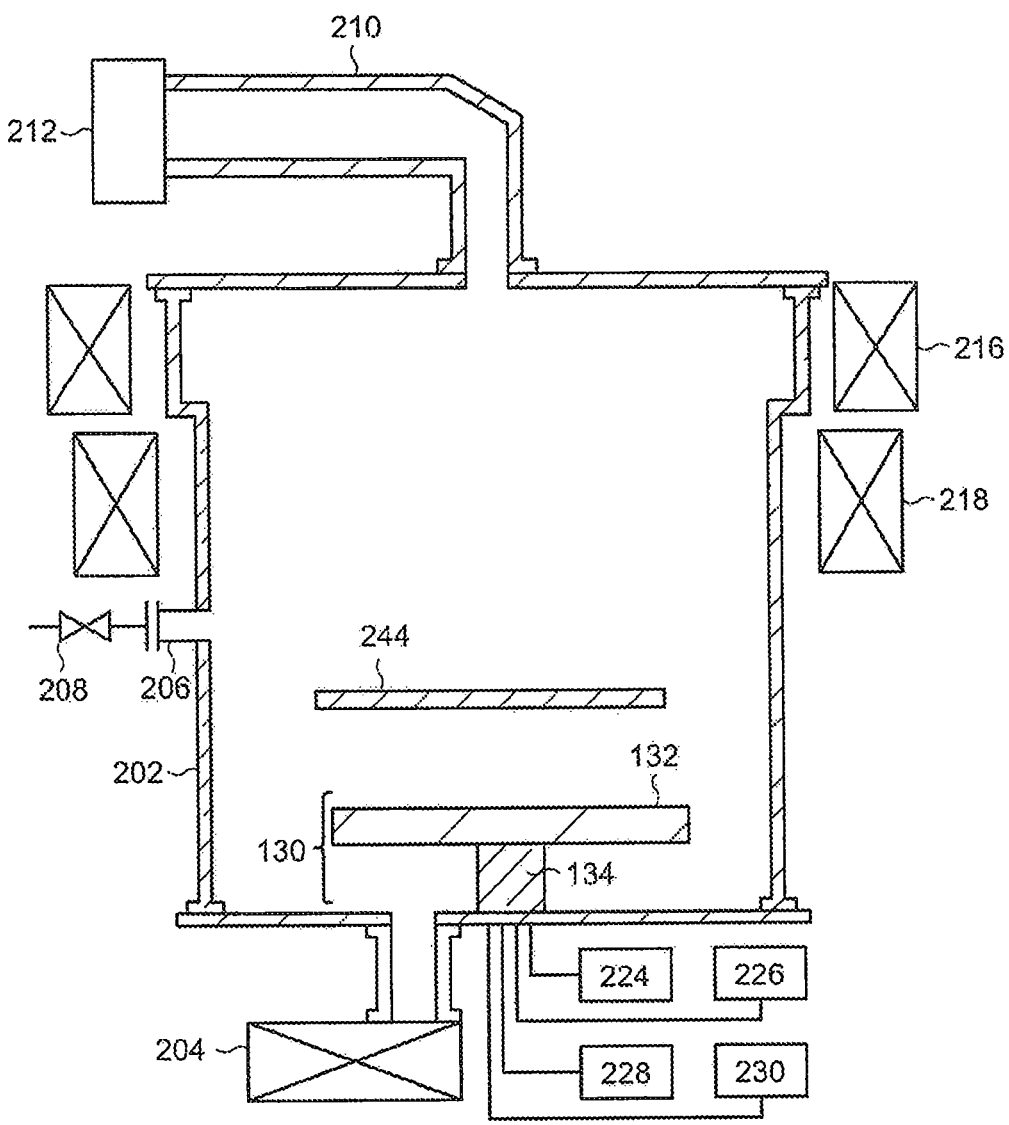
FIG. 5 is a drawing showing a structure of a film forming device according to an embodiment of the present invention.
Figure 6:
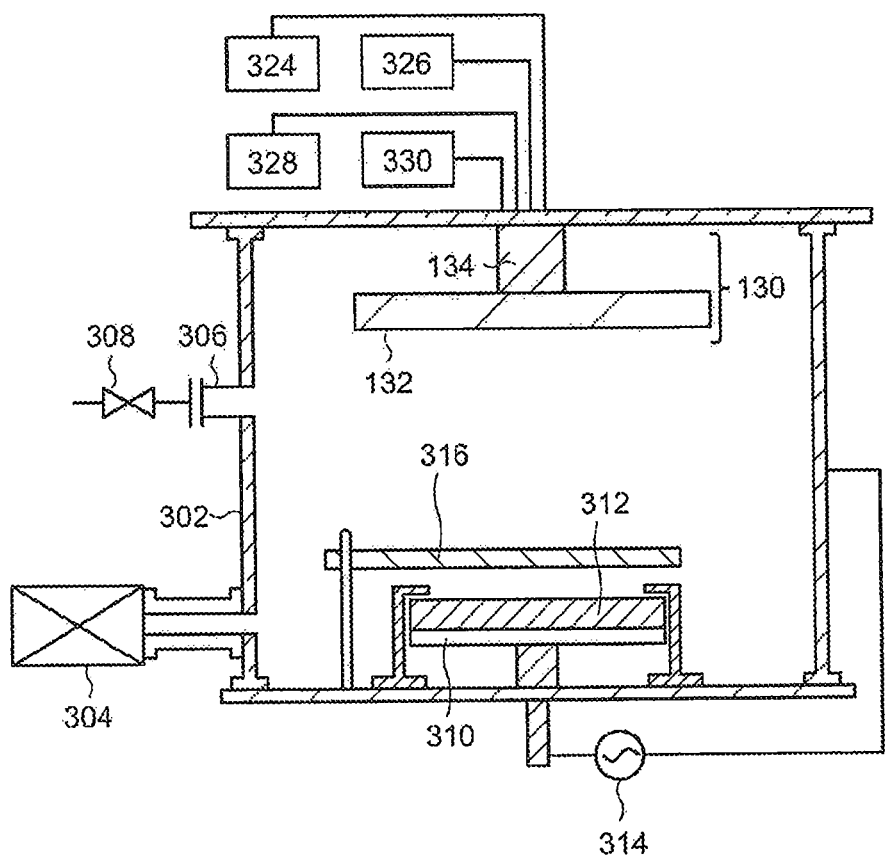
FIG. 6 is a drawing showing a structure of a film forming device according to an embodiment of the present invention.
Figure 7:
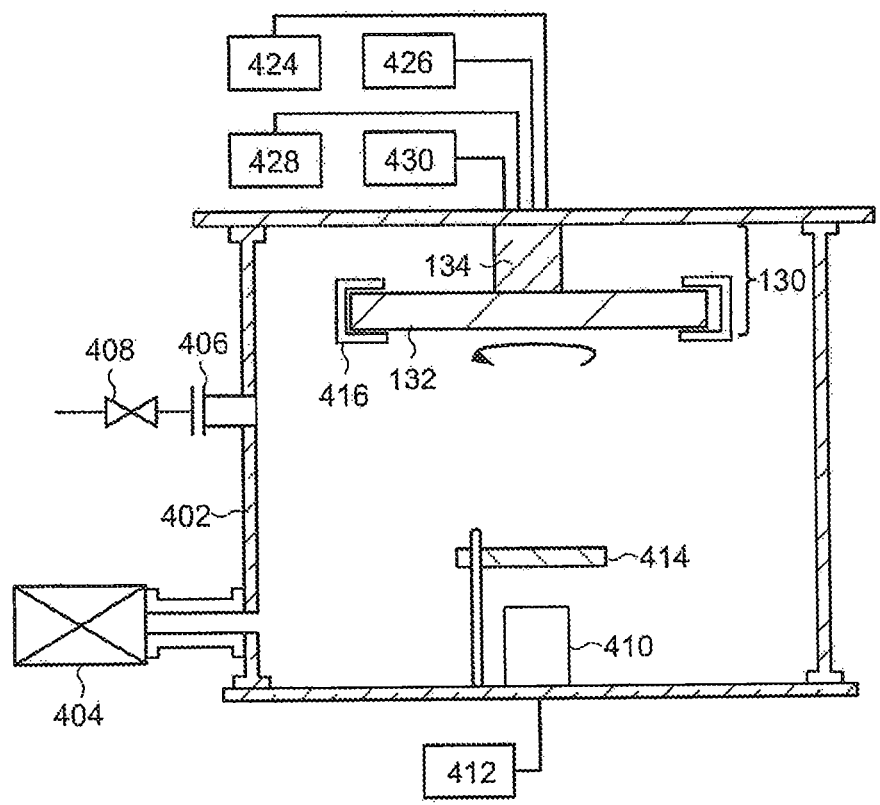
FIG. 7 is a drawing showing a structure of a film forming device according to an embodiment of the present invention.

In the present embodiment, a variety of film forming devices having the substrate supporting unit 130 described in the First Embodiment is explained using FIG. 5 to FIG. 7. Descriptions regarding the structures the same as those of the First Embodiment may be omitted.

1. CVD Device

FIG. 5 is a schematic drawing of a CVD device 200 as a film forming device. The CVD device 200 possesses a chamber 202 providing a space in which a reaction gas is chemically reacted.

An exhaust device 204 is connected to the chamber 202, by which a pressure in the chamber 202 can be reduced. An inlet tube 206 is further provided to the chamber 202 to introduce a reaction gas, and the reaction gas for film preparation is introduced into the chamber 202 through a valve 208. As a reaction gas, a variety of gases can be used, depending on the films to be prepared. The gas may be liquid at a normal temperature. For example, silane, dichlorosilane, tetraethoxysilane, and the like may be used, by which a thin film of silicon, silicon oxide, silicon nitride, or the like can be formed. Alternatively, the use of tungsten fluoride, trimethyl aluminum, or the like allows the formation of a metal thin film of tungsten, aluminum, or the like.

Similar to the etching device 100, a microwave source 212 may be provided at an upper portion of the chamber 202 through a waveguide tube 210. A microwave generated by the microwave source 212 is introduced into the chamber 202 by the waveguide tube 210. The reaction gas is plasmatized by the microwave, and chemical reactions of the gas are promoted by a variety of active species included in the plasma, by which products obtained by the chemical reactions are deposited onto a substrate to form a thin film. As an optional structure, a magnet 244 may be arranged in the chamber 202 to increase a plasma density. The substrate supporting unit 130 described in the First Embodiment is provided at a lower portion of the chamber 202, which enables deposition of a thin film in a state where a substrate is placed on the stage 132. Similar to the etching device 100, magnets 216 and 218 may be disposed on a side surface of the chamber 202.

A heater power source 224 for controlling the first heater 150 and the second heater 140 respectively arranged in the shaft 134 and the stage 132 is further provided to the CVD device 200. The CVD device 200 may further possess a power source 226 for supplying a high-frequency power to the stage 132, a power source 228 for an electrostatic chuck, a temperature controller 230 for controlling a temperature of a medium circulated in the stage 132, and the like. A rotation-controlling device (not illustrated) for rotating the stage 132 may be further provided to the CVD device 200 as an optional structure.

2. Sputtering Device

FIG. 6 is a schematic view of a sputtering device 300 as a film forming device. The sputtering device 300 possesses a chamber 302 and supplies a space for collision of high-speed ions with a target and deposition of target atoms generated by the collision.

An exhaust device 304 for reducing a pressure in the chamber 302 is connected to the chamber 302. The chamber 302 is equipped with an inlet tube 306 and a valve 308 for introducing a sputtering gas such as argon into the chamber 302.

A target stage 310 for supporting a target including a material to be deposited and serving as a cathode is disposed at a lower portion of the chamber 302, over which a target 312 is arranged. A high-frequency power source 314 is connected to the target stage 310, and plasma is generated in the chamber 302 by the high-frequency power source 314.

The substrate supporting unit 130 described in the First Embodiment may be disposed at an upper portion of the chamber 302. In this case, thin-film formation proceeds in a state where a substrate is placed under the stage 132. Similar to the etching device 100 and the CVD device 200, the sputtering device 300 is equipped with a heater power source 324 for controlling the first heater 150 and the second heater 140 respectively provided in the shaft 134 and the stage 132. A power source 326 for supplying a high-frequency power to the stage 132, a power source 328 for an electrostatic chuck, a temperature controller 330, or the like may be connected to the substrate supporting unit 130. A rotation-controlling device (not illustrated) for rotating the stage 132 may be further provided to the sputtering device 300 as an optional structure.

Argon ions accelerated by the plasma generated in the chamber 302 collide with the target 312, and the atoms in the target 312 are sputtered. The sputtered atoms fly to the substrate and are deposited onto the substrate placed under the stage 132 while a shutter 316 is opened.

In the present embodiment, a structure is exemplified where the substrate supporting unit 130 and the target stage 310 are respectively arranged at the upper portion and the lower portion of the chamber 302. However, the present embodiment is not limited to this structure, and the sputtering device 300 may be configured so that the target is placed over the substrate supporting unit 130. Alternatively, the substrate supporting unit 130 may be disposed so that a main surface of the substrate is perpendicular to a horizontal plane and the target stage 310 faces the main surface.

3. Evaporation Device

FIG. 7 is a schematic view of an evaporation device 400 as a film forming device. The evaporation device 400 possesses a chamber 402 and supplies a space for vaporization of a material in an evaporation source 410 and deposition of the vaporized material onto a substrate.

An exhaust device 404 for highly evacuating the inside of the chamber 402 is connected to the chamber 402. The chamber 402 is equipped with an inlet tube 406 for returning the inside of the chamber 402 to an atmospheric pressure, and an inert gas such as nitrogen and argon is introduced into the chamber 402 through a valve 408.

The substrate supporting unit 130 described in the First Embodiment may be disposed at an upper portion of the chamber 402. Deposition of the material proceeds in a state where a substrate is placed under the stage 132. Similar to the etching device 100, the CVD device 200, and the sputtering device 300, the evaporation device 400 is further equipped with a heater power source 424 for controlling the first heater 150 and the second heater 140 respectively provided in the shaft 134 and the stage 132. A power source 426 for an electrostatic chuck, a temperature controller 428, a rotation-controlling device 430 for rotating the stage 132, and the like may be provided to the substrate supporting unit 130. The substrate supporting unit 130 may further possess a mask holder 416 for fixing a metal mask between the substrate and the evaporation source 410, by which the metal mask can be arranged near the substrate so that opening portions of the metal mask overlap with the regions where the material is to be deposited.

The evaporation source 410 is disposed on a lower side of the chamber 402, and the material to be evaporated is charged into the evaporation source 410. A heater for heating the material is provided to the evaporation source 410 and is controlled by a controlling device 412. Evaporation is started by highly evacuating the inside of the chamber 402 with the exhaust device 404 and heating the evaporation source 410 to vaporize the material. A shutter 414 is opened when an evaporation rate becomes constant, thereby starting deposition of the material over the substrate.

As described above, the film-formation devices according to the present embodiment, such as the CVD device 200, the sputtering device 300, and the evaporation device 400, may possess the substrate supporting unit 130 explained in the First Embodiment. Thus, a temperature of a substrate can be entirely and uniformly controlled, and variation in physical properties of a thin film to be prepared can be significantly reduced.

EXAMPLE

In the following Example, it is explained that the use of the substrate supporting unit 130 described in the First Embodiment allows the whole of the stage 132 to be uniformly heated.

Simulation of heating temperature was carried out using the substrate supporting unit 130 having the structure shown in FIG. 2A to FIG. 3B as an Example. Set conditions of the simulation were as follows. Note that a substrate supporting unit without the first heater 150 was used as a Comparable Example.

(1) Upper Plate 132a and Lower Plate 132b
    Diameter of 350 mm; thickness of 30 mm; thermal conductivity of 170 W/m·K
(2) First Heater 150
    Cross-sectional area of 2.54 mm$^2$; length of 1300 mm, amount of heat of 400 W
(3) Second Heater 140
    Cross-sectional area of 85 mm$^2$; length of 1500 mm, amount of heat of 600 W
(4) Main Shaft 136
    External diameter of 60 mm, internal diameter of 50 mm, length of 90 mm, thermal conductivity of 170 W/m·K
(5) Connector 138
    External diameter of 90 mm, internal diameter of 50 mm, thickness of 5 mm, thermal conductivity of 170 W/m·K
(6) Flange 144
    External diameter of 90 mm, internal diameter of 50 mm, thickness of 10 mm, thermal conductivity of 170 W/m·K
(7) External Environment
    Vacuum atmosphere, temperature of 30° C., emissivity of 0.3

Figure 8A:
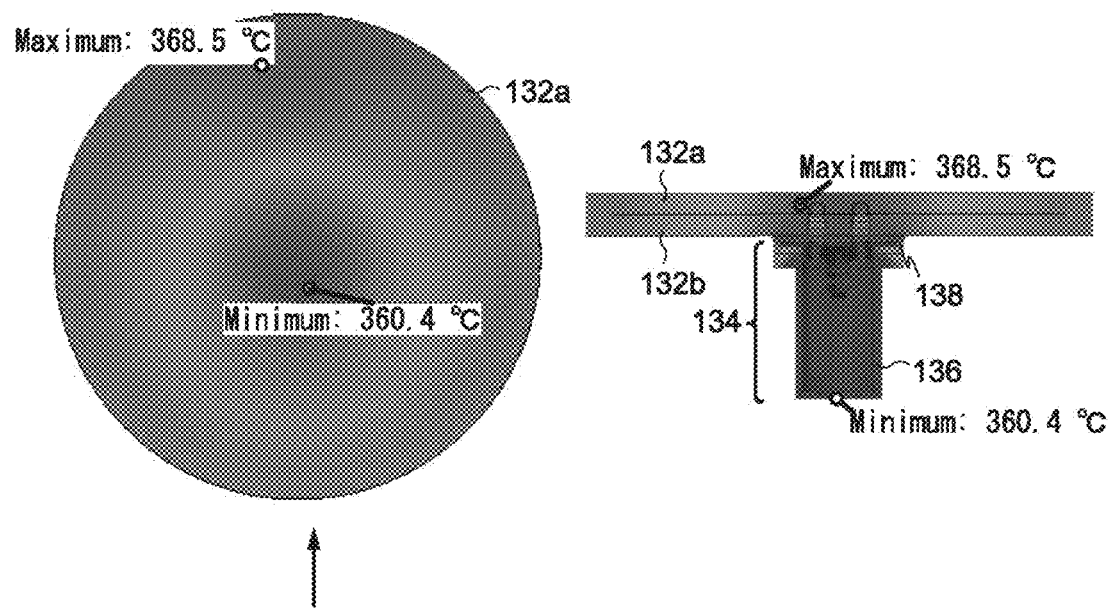
FIG. 8A is a drawing showing a temperature distribution of a substrate supporting unit of the Example.
Figure 8B:
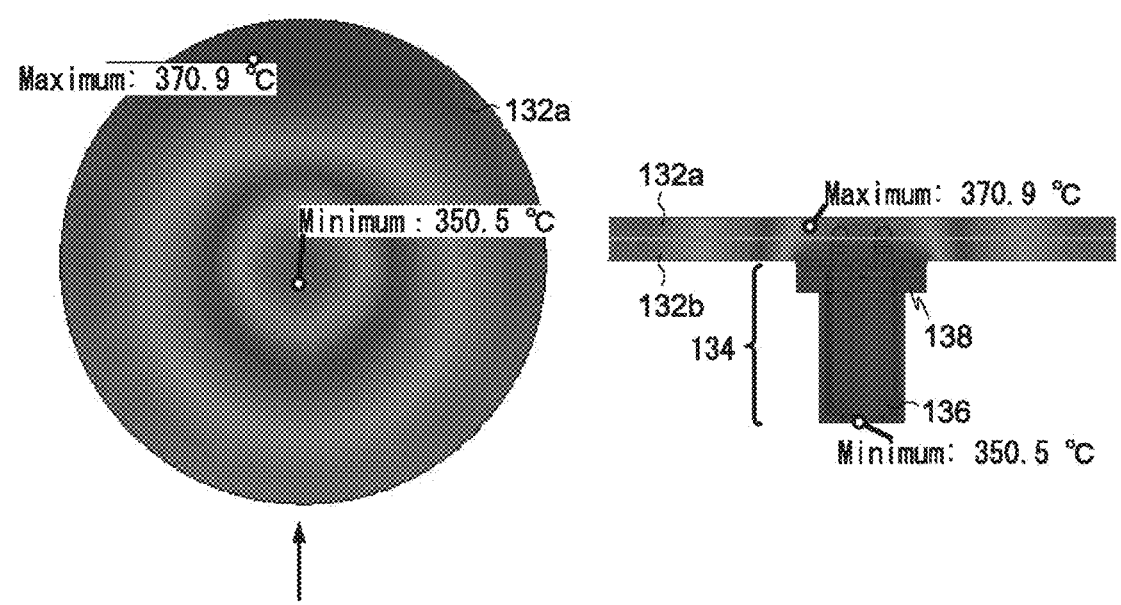
FIG. 8B is a drawing showing a temperature distribution of a substrate supporting unit of the Comparative Example.

The temperature distributions of the substrate supporting units 130 of the Example and Comparable Example at the time when an equilibrium was reached are respectively shown in FIG. 8A and FIG. 8B. In each figure, the left side is a top view of the substrate supporting units 130, and the right side is a cross-sectional view viewed in an arrow direction. In the upper plate 132a of the substrate supporting unit of the Comparable Example, a large temperature distribution was observed, and the temperature decreased approaching the center from the peripheral region as shown in FIG. 8B. Specifically, the location exhibiting the maximum temperature was the peripheral region of the upper plate 132a, and the temperature thereof was 370.9° C. On the other hand, the location exhibiting the minimum temperature was the center portion of the upper plate 132a, and the temperature thereof was 350.5° C. The difference between the maximum temperature and the minimum temperature was 20.4° C.

In contrast, in the substrate supporting unit 130 of the Example, although the locations exhibiting the maximum temperature and the minimum temperature were similar to those of the Comparable Example, the temperatures of the former and the latter were 368.5° C. and 360.4° C., respectively, and the difference therebetween was only 80. ° C. as shown in FIG. 8A.

It was found that, in the substrate supporting unit 130 according to an embodiment of the present invention, the use of the first heater 150 installed at an upper terminal portion of the shaft 134, that is, in a portion of the shaft 134 close to the stage 132, compensates the heat loss due to the thermal conduction to the shaft 134 from the center portion of the stage 132, which enables uniform heating of the stage 132 as demonstrated by the aforementioned simulation. Therefore, it is possible to more precisely control the semiconductor processes by using the film forming device or the film processing device equipped with the substrate supporting unit 130 because a variety of thin films having uniform properties can be formed on a substrate or because a thin film can be uniformly processed over a substrate.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

It is properly understood that another effect different from that provided by the modes of the aforementioned embodiments is achieved by the present invention if the effect is obvious from the description in the specification or readily conceived by persons ordinarily skilled in the art.

What is claimed is:
1. A substrate supporting unit comprising:
    a shaft extending in an axial direction;
    a first heater located in the shaft and configured to heat an upper portion of the shaft, the first heater comprising a first heating element having a first cross section in a plane through the axial direction, the first cross section of the first heating element having a first plurality of discontinuous cross-sectional areas; and
    a stage located over the shaft and comprising:
        a first plate;
        a second plate over the first plate; and
        a second heater between the first plate and the second plate, the second heater comprising a second heating element having a second cross section in the plane through the axial direction, the second cross section of the second heating element having a second plurality of discontinuous cross-sectional areas,
    wherein each individual discontinuous cross-sectional area of the second cross section of the second heating element is greater than each individual discontinuous cross-sectional area of the first cross section of the first heating element.

2. The substrate supporting unit according to claim 1, wherein the shaft comprises a main shaft, and
the first heater is sandwiched between the main shaft and the first plate.

3. The substrate supporting unit according to claim 2, wherein the shaft further comprises a connector between the main shaft and the first plate,
the connector is in contact with at least one of the main shaft and the first plate, and
the first heater is sandwiched between the main shaft and the connector.

4. The substrate supporting unit according to claim 3, wherein the main shaft has a tube shape and possesses a ring-shaped flange at a top edge portion thereof, and
the connector has a ring shape and covers the flange.

5. The substrate supporting unit according to claim 3, wherein the connector is brazed or welded to the first plate.

6. The substrate supporting unit according to claim 1, wherein the shaft possesses a tube shape and has a hollow therein,
a wiring connected to the first heater and a wiring connected to the second heater are arranged in the hollow, and
the first heater is arranged so as to surround the hollow.

7. The substrate supporting unit according to claim 1, wherein a cross-sectional area of the shaft is smaller than a cross-sectional area of the first plate,
the shaft overlaps with a center of the first plate, and
the first heater is arranged so as to surround a normal line of the first plate passing through the center.

8. The substrate supporting unit according to claim 1, wherein the shaft is brazed or welded to the first plate.

9. A film forming device comprising the substrate supporting unit according to claim 1.

10. A film processing device comprising the substrate supporting unit according to claim 1.

* * * * *